United States Patent

Ozaki et al.

[11] Patent Number: 5,164,803
[45] Date of Patent: Nov. 17, 1992

[54] CMOS SEMICONDUCTOR DEVICE WITH AN ELEMENT ISOLATING FIELD SHIELD

[75] Inventors: Hiroji Ozaki; Shinichi Satoh; Takahisa Eimori; Wataru Wakamiya; Yoshinori Tanaka, all of Hyogo, Japan

[73] Assignee: Mitsubishi Denki Kabushiki Kaisha, Tokyo, Japan

[21] Appl. No.: 657,261

[22] Filed: Feb. 19, 1991

Related U.S. Application Data

[63] Continuation of Ser. No. 450,769, Dec. 4, 1989, abandoned.

[30] Foreign Application Priority Data

Dec. 24, 1988 [JP]  Japan ................. 63-327066

[51] Int. Cl.⁵ .............. H01L 29/06; H01L 29/78; H01L 29/86
[52] U.S. Cl. .................. 257/372; 257/394; 257/630
[58] Field of Search ......... 357/53, 45, 23.4, 23.11, 357/23.6, 23.13, 23.14, 23.1, 52, 84

[56] References Cited

U.S. PATENT DOCUMENTS

| | | | |
|---|---|---|---|
| 3,811,076 | 5/1974 | Smith | 357/53 |
| 4,561,170 | 12/1985 | Doering et al. | |
| 4,654,828 | 3/1987 | Hagiwara et al. | 357/23.11 |
| 4,702,000 | 10/1987 | Matlock et al. | 357/23.11 |
| 4,766,474 | 8/1988 | Nakagawa | 357/53 |
| 4,786,954 | 11/1988 | Morie et al. | 357/45 |
| 4,818,725 | 4/1989 | Lichtel, Jr. et al. | 357/23.11 |
| 4,908,683 | 3/1990 | Matlock et al. | 357/23.11 |

FOREIGN PATENT DOCUMENTS

| | | |
|---|---|---|
| 0150993 | 1/1985 | European Pat. Off. |
| 60-66444 | 4/1985 | Japan |
| 60-72259 | 4/1985 | Japan |
| 61-24859 | 11/1985 | Japan |
| 62-162353 | 1/1986 | Japan |
| 62-206874 | 9/1987 | Japan |
| 62-244163 | 10/1987 | Japan |

*Primary Examiner*—Andrew J. James
*Assistant Examiner*—Carl Whitehead, Jr.
*Attorney, Agent, or Firm*—Lowe, Price, LeBlanc & Becker

[57] ABSTRACT

A semiconductor device comprises an MOSFET (13) comprising a switching gate electrode (5) and a field shield MOS structure (11) formed on an element isolating region of a semiconductor substrate (1) and performs the element isolation by applying a bias voltage to the field shield (9). The field shield (9) is provided on the element isolating region of the semiconductor substrate (1) through an insulating film (8). A sidewall spacer (12) having its width set such that the field shield (9) may be an offset gate is formed on the side portion of the field shield (9). Then, source and drain layers (6) are formed on the main surface of the semiconductor substrate (1) so as not to overlap with the field shield (9). According to the semiconductor device, since the field shield (9) is the offset gate, it is possible to set high the threshold value on a parasitic MOS transistor and miniaturize the elements.

4 Claims, 6 Drawing Sheets

CMOS SEMICONDUCTOR DEVICE WITH AN ELEMENT ISOLATING FIELD SHIELD

This application is a continuation of application Ser. No. 07/450,769 filed Dec. 14, 1989 now abandoned.

BACKGROUND OF THE INVENTION

1. Field of the Invention

The present invention relates to a semiconductor device and a method of manufacturing the same and, more particularly, to a semiconductor device and a method of manufacturing the same improved such that the device isolation suitable for miniaturization is performed.

2. Description of the Background Art

Conventionally, a LOCOS (Local Oxidation of Silicon) method is used as an element isolating method in an MOS IC using a silicon as a semiconductor.

FIG. 5 is a sectional view of a conventional semiconductor device in which elements are isolated by the LOCOS method. Referring to FIG. 5, a P well 2 formed on the main surface of an n type semiconductor substrate 1. The P well 2 is isolated from another element (not shown) by a field oxide film 3. A gate electrode 5 is provided on the main surface of the P well 2 through a gate insulating film 4. Source and drain layers 6 are formed on the main surface of the P well 2 (except for a portion beneath the gate electrode 5). A conventional semiconductor device in which the elements are isolated by the LOCOS method is structured as described above. According to the element isolation by this LOCOS method, an isolation area can be relatively small, but on the other hand, there was a disadvantage that there was a limit of the reduction in an isolated width because of a bird's beak 3a at the end portions of the field oxide film 3. In addition, as an element is miniaturized, it becomes necessary to make a high impurity concentration of a silicon substrate in the element isolating region. In this case, as a transistor channel width is decreased, a threshold voltage Vth of an MOS transistor is increased, which is known as a narrow channel effect. Therefore, the LOCOS method is not satisfactory because the element has been increasingly miniaturized recently.

As an improvement on the LOCOS method, a field plate method has been proposed. FIG. 6 is a sectional view of the conventional semiconductor device in which elements are isolated by the field plate method disclosed in Japanese Patent Laying-Open Gazette No. 66444/1985. Referring to FIG. 6, a field oxide film 3 is formed on an element isolating region of the semiconductor substrate 1 by the LOCOS method. A field plate 7 is formed on the field oxide film 3. An MOSFET comprising source and drain layers 6, a gate insulating film 4 and a gate electrode 5 is formed on an active region isolated by the field oxide film 3. According to this conventional example, since the potential on the field plate 7 on the field oxide film is the same as that of the semiconductor substrate 1, a parasitic MOS transistor is always off, so that a leak current is prevented from being generated. However, in this field plate method, it is necessary to align the field oxide film 3 with the field plate 7 and there was a difficulty in this alignment. In addition, there was a disadvantage that there was a limit of decrease in an isolated width because of the bird's beak 3a at the end portions of the field oxide film 3 in this method.

In order to improve these disadvantages, a field shield method has been proposed by which a field oxide film is formed thin and a field shield is formed thereon to isolate elements.

FIG. 7 is a sectional view of a semiconductor device in which elements are isolated by the field shield method disclosed in Japanese Patent Laying-Open Gazette No. 206874/1987. Referring to FIG. 7, a P well 2 is formed on the main surface of an n type semiconductor substrate 1. An MOSFET comprising source and drain layers 6, a gate electrode 5 formed on the surface of the P well 2 through a second gate insulating film 4 in the P well 2. A field shield 9 comprising polysilicon is formed on an element isolating region of the semiconductor substrate 1 through the first gate insulating film 8. The principle of the element isolation by this field shield method is as follows. That is, in an MOS structure comprising the field shield 9, the first gate insulating film 8 and the P well 2, a p+ layer 10 is formed on the surface of the semiconductor substrate by applying a negative voltage to the field shield 9 to electrically isolate elements by the p+ layer 10.

The element isolation by the conventional field shield method is structured as described above. When the above-described field shield method is applied to the submicron isolation, it is necessary to introduce something serving as a channel cut beneath the field shield 9 after the formation of the field shield 9 in order to avoid the parasitic MOS effect. However, it was difficult to implement isolation without the introduction of something serving as this channel cut. In addition, there was another disadvantage that the MOS threshold voltage Vth of the MOSFET transistor is increased together with the decrease in the channel width of the transistor by the narrow channel effect if something serving as the channel cut is introduced beneath the field shield after the formation of the field shield 9. Therefore, it was difficult to implement the submicron isolation by the above-described field shield method in the present condition.

SUMMARY OF THE INVENTION

An object of the present invention is to provide a semiconductor device capable of effectively avoiding the parasitic MOS effect without increasing the threshold voltage of the MOS transistor.

Another object of the present invention is to provide a semiconductor device capable of being miniaturized and avoiding the parasitic MOS effect.

A further object of the present invention is to provide a method of manufacturing a semiconductor device capable of avoiding the parasitic MOS effect without increasing the threshold voltage of the MOS transistor.

Still another object of the present invention is to provide a method of manufacturing a semiconductor device capable of avoiding the parasitic MOS effect and being miniaturized.

A still further object of the present invention is to provide a method of manufacturing a semiconductor device and of simplifying the processes at the same time.

The present invention relates to a semiconductor device comprising an MOSFET comprising a switching gate electrode and a field shield MOS structure formed on an element isolating region and performing the element isolation by applying a bias voltage to the field shield. In order to solve the above-described disadvantage, the semiconductor device in accordance with the present invention comprises a semiconductor substrate having a main surface; a field shield provided on an element isolating region of the semiconductor substrate through a first gate insulating film; a sidewall spacer formed on the side of the field shield and having its width set such that the field shield may be an offset gate; a switching gate electrode formed on the semiconductor substrate through a second gate insulating film; and source and drain layers formed on the main surface of said semiconductor substrate so as not to overlap with the field shield.

In the present invention, the film thickness of the first gate insulating film is preferably thicker than that of the second gate insulating film.

In addition, it is preferable to form an ion implantation layer determining the threshold value of the MOSFET and the threshold value of the parasitic MOS transistor of the field shield MOS structure on the main surface of the semiconductor substrate.

A method of manufacturing a semiconductor device comprising an MOSFET comprising a switching gate electrode and a field shield MOS structure formed on an element isolating region comprises the steps of implanting ions determining the threshold value of the MOSFET and the threshold value of the parasitic MOS transistor of the field shield MOS structure on the main surface of the semiconductor substrate; forming a field shield on the element isolating region of the semiconductor substrate through a first gate insulating film after the ion implantation; forming a sidewall spacer having its width set such that the field shield may be an offset gate on a side portion of the field shield; forming the switching gate electrode on the semiconductor substrate through the second gate insulating film after the formation of the sidewall spacer; and forming an impurity diffusion layer serving as source and drain layers on the main surface of the semiconductor substrate using the field shield, the sidewall spacer and the switching gate electrode as a mask for impurity introduction after the formation of the switching gate electrode.

The semiconductor device in accordance with the present invention comprises a sidewall spacer formed on the side of the field shield and having its width such that the field shield may be an offset gate. In addition, the source and drain layers are formed on the main surface of the semiconductor substrate so as not to overlap with the field shield. Therefore, it is possible to set the Vth of the parasitic MOS transistor high and effectively avoid the parasitic MOS effect. In addition, since it is not necessary to introduce something serving as a channel cut after the formation of the field shield like the conventional field shield method when the element is minituarized, the narrow channel effect is prevented from being generated. Therefore, it becomes possible to perform the submicron element isolation in miniaturizing the element. In addition, since the field shield is the offset gate, its voltage resistance is improved.

According to the method of manufacturing the semiconductor device in accordance with the present invention, since the ion implantation determining the threshold value of the MOSFET and the threshold value of the parasitic MOS transistor of the field shield MOS structure can be performed one time, the process can be simplified. In addition, since impurity diffusion layers serving as the source and drain layers are formed on the main surface of the semiconductor substrate using the field shield, the sidewall spacer and the switching gate electrode as a mask for the impurity introduction, the field shield does not overlap with the source and drain layers. As a result, it is possible to set the Vth of the parasitic MOS transistor high and avoid the parasitic MOS effectively. In addition, since it is not necessary to introduce something serving as a channel cut after the formation of the field shield like the conventional field shield method in miniaturizing the devices, the narrow channel effect could not be generated. Therefore, the submicron element isolation can be performed to miniaturize the devices.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, a description is given of an embodiment of the present invention in reference to figures.

Figure 1:
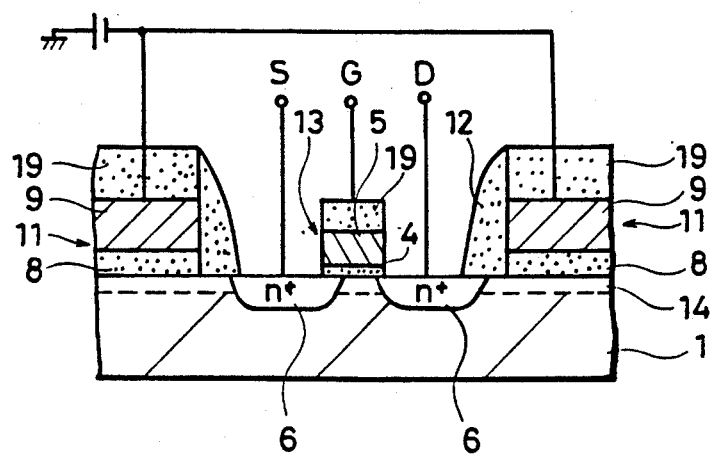
FIG. 1 is a sectional view of a semiconductor device in accordance with one embodiment of the present invention.
Figure 7:
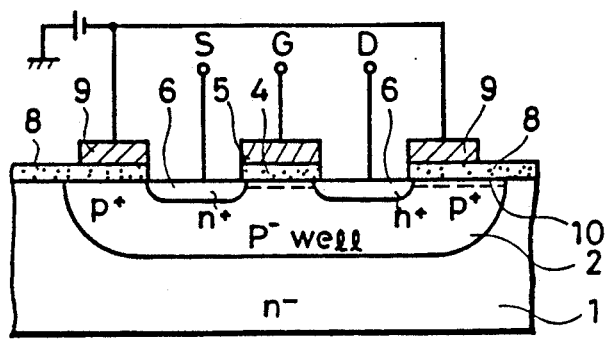
FIG. 7 is a sectional view of a conventional semiconductor device in which elements are isolated by the field shield method.

FIG. 1 is a sectional view of a semiconductor device in accordance with one embodiment of the present invention. Referring to FIG. 1, a field shield MOS structure 11 is provided on an element isolating region of a p− semiconductor substrate 1. The field shield MOS structure 11 comprises a first gate insulating film 8 serving as an oxide film formed on the semiconductor substrate 1 and a field shield 9 formed on the first gate insulating film 8. The field shield 9 is formed of, for example polysilicon. A CVD oxide film 19 is formed on the field shield 9. A sidewall spacer 12 having its width set such that the field shield 9 may be an offset gate is formed on the side portion of the field shield MOS structure 11. An MOSFET 13 comprising source and drain layers 6 formed on the main surface of the semiconductor substrate 1 and a switching gate electrode 5 provided on the semiconductor substrate through the second insulating film 4 is formed on the active region of the semiconductor substrate 1. A CVD oxide film 19 is formed on the switching gate electrode 5. The film thickness of the first gate insulating film 8 is thicker than that of the second gate insulating film 4. In addition, an ion implantation layer 14 which determines the threshold value Vth of the MOSFET 13 and the threshold value Vth of the parasitic MOS transistor of the field shield MOS structure 11 is formed on the main surface of the semiconductor substrate 1. According to this embodiment, in the field shield MOS structure 11 comprising the field shield 9, the first gate insulating film 8 and the semiconductor substrate 1, a p+ layer is formed on the surface of the semiconductor substrate by applying a predetermined voltage to the field shield 9 and this p+ layer isolates the elements. In this case, the sidewall spacer 12 having its width set such that the field shield 9 may be an offset gate is formed on the side portion of the field shield MOS structure 11, the source and drain layers 6 are formed on the semiconductor substrate 1 so as not to overlap with the field shield 9 and the film thickness of the first insulating film 8 is made thicker than that of the second insulating film 4, whereby it is possible to set the threshold value Vth of the parasitic MOS transistor high and avoid the parasitic MOS effect effectively. In addition, when the elements are miniaturized, since it is not necessary to introduce the channel cut beneath the field shield after the formation of the field shield like the conventional field shield method (shown in FIG. 7), the narrow channel effect is not generated. Therefore, it is possible to perform the submicron element isolation and the elements can be miniaturized. In addition, since the field shield 9 is the offset gate, its voltage resistance is improved.

Then, a description is made of the manufacturing processes of the semiconductor device shown in FIG. 1.

Figure 3A:
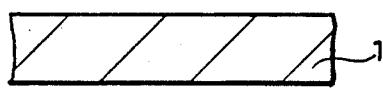
FIGS. 3A to 3G are sectional views of the semiconductor device shown in FIG. 1 showing its manufacturing processes.
Figure 3B:
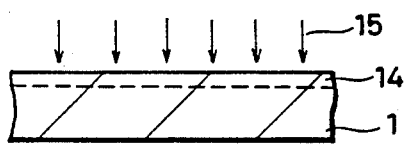

FIGS. 3A to 3H are sectional views of the semiconductor device shown in FIG. 1 showing its manufacturing steps. Referring to FIG. 3A, a p type semiconductor substrate 1 is prepared. Then, referring to FIG. 3B, an ion implantation layer 14 is formed on the main surface of the semiconductor substrate 1 by implanting ions 15 of B+ and BF$_2$+ serving as a channel stopper by approximately $10^{16} \sim 10^{17}$ cm$^{-3}$. By this ion implantation, the threshold value Vth of the field shield MOS structure to be formed later and the threshold value Vth of the MOSFET to be formed later are determined at the same time. In addition, in a conventional example, the ion implantation for the channel cut and the ion implantation for controlling the threshold value Vth were performed separately, that is, ion implantation were performed two times in total. However, in this embodiment, the ion implantation is performed only one time, so that the number of processes is decreased by one. Therefore, the processes can be simplified because of the decrease in processes.

Figure 3C:
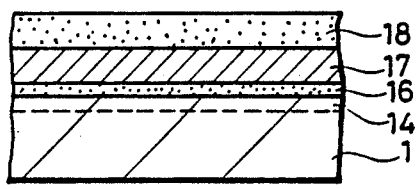

Referring to FIG. 3C, an oxide film (SiO$_2$) 16 serving as the first gate insulating film is formed on the main surface of the semiconductor substrate by heat oxidation or CVD method. The film thickness of the oxide film 16 is adjusted to the approximately 200~1500 Å. Then, a polysilicon layer 17 serving as a conductive layer is deposited on the whole surface by approximately 1000~2000 Å by a LPCVD method. In order to reduce the resistance of this polysilicon layer 17, ion implantation is made of POCl$_3$ on the polysilicon layer 17. Also, P-doped polysilicon may be deposited on the oxide film 16 by the LPCVD method. Then, a CVD oxide film 18 is deposited on the polysilicon layer 7. Thereafter, referring to FIGS. 3C to 3D, these are patterned by the conventional photolithography and etching to form a field shield MOS structure 11 comprising a first gate insulating film 8, a field shield 9 formed on the first gate insulating film 8 and a patterned CVD oxide film 19 on the element isolating region of the semiconductor substrate 1 while an active region is exposed.

Figure 3D:
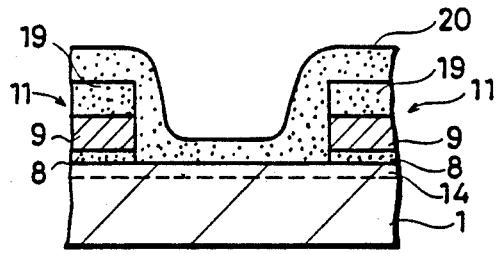

Referring to FIG. 3D a CVD oxide film 20 is deposited on the whole surface of the semiconductor substrate 1 comprising the field shield MOS structure 11.

Figure 3E:
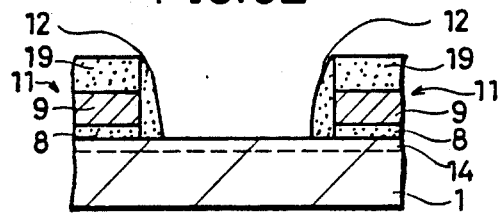

Thereafter, referring to FIG. 3E, the CVD oxide film 20 is etched away by reactive ion etching and a sidewall spacer 12 is formed on the side portion of the field shield MOS structure 11. The sidewall spacer 12 has its width set such that the field shield 9 may be an offset gate. The width of the sidewall 12 is set by controlling the film thickness of the CVD oxide film 19 formed on the field shield 9, the film thickness of the CVD oxide film 20 deposited after the patterning of the field shield 9 and an etching condition.

Figure 3F:
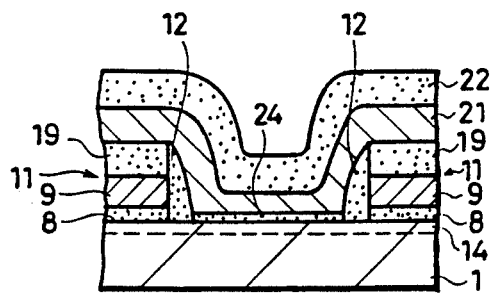

Referring to FIG. 3F, an oxide film 24 serving as a gate insulating film of the switching gate electrode is formed on the main surface of the semiconductor substrate 1 by the heat oxidation method or the CVD method. The film thickness of the oxide film 24 is adjusted to be 100~200 Å and it is thinner than the two of the first gate insulating film 8. Then, a polysilicon layer 21 serving as a switching gate electrode is formed on the whole surface and then a CVD oxide film 22 is deposited thereon.

Figure 3G:
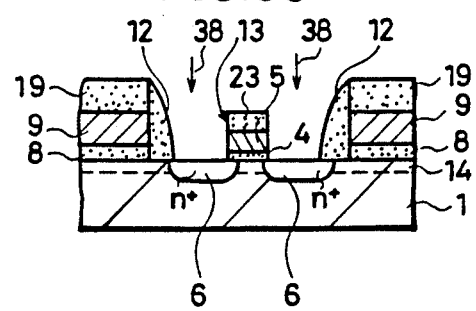

Referring to FIG. 3G, these films are patterned by usual photolithography and etching to form a MOSFET comprising a second gate insulating film 4, a switching gate electrode 5 and a pattern CVD oxide film 23 on the active region.

Then, source and drain layers 6 are formed on the semiconductor substrate 1 by implanting n+ impurity ions, for example As+ ions 38 in a self-aligning manner using the field shield 9, the sidewall spacer 12 and the switching gate electrode 5 as a mask for impurity introduction. Since ion implantation is performed using the sidewall spacer 12 as a mask in this way, the field shield 9 does not overlap with the obtained source and drain layers 6. In addition, when a LDD transistor is made, the CVD oxide film is further deposited, and then the sidewalls spacer is formed on the side portion of the switching gate electrode 5 by the reactive ion etching and thereafter, ion implantation is performed again on the source and drain layers 6 and then annealing treatment is subsequently made.

Then, an interlayer insulating film (not shown) is formed to form a wiring and, as a result, the semiconductor device shown in FIG. 1 can be provided.

Figure 2:
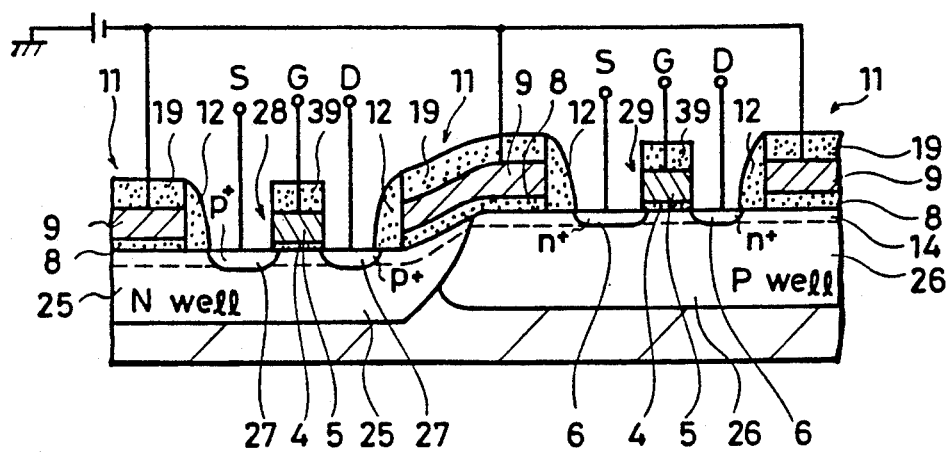
FIG. 2 is a sectional view of a semiconductor device in accordance with another embodiment of the present invention.

FIG. 2 is a sectional view of a semiconductor device of a twin-tab structure in accordance with another embodiment of the present invention. Referring to FIG. 2, an N well 25 and a P well 26 are formed adjacently on the main surface of the semiconductor substrate. The field shield MOS structure 11 is provided in the element isolating region comprising the boundary portion of the N well 25 and the P well 26. The field shield MOS structure 11 comprises a first gate insulating film 8 formed on the semiconductor substrate 1, and a field shield 9 formed on the first gate insulating film 8. A CVD oxide film 20 is formed on the field shield 9. A sidewall 12 having its width set such that the field shield 9 may be an offset gate is formed on the side wall of the field shield MOS structure 11. A P channel MOSFET 28 comprising source and drain layers 27 formed on the main surface of the N well 25, and a switching gate electrode 5 provided on the surface of the N well 25 through the second gate insulating film 4 is formed on the N well 25. A CVD oxide film 39 is formed on the switching gate electrode 5.

An N channel MOSFET 29 comprising source and drain layers 6 formed on the surface of the P well 26 and a switching gate electrode 5 provided on the surface of the P well 26 through the second gate insulating film 4 is formed on the P well 26. A CVD oxide film 39 is formed on the switching gate electrode 5. The film thickness of the first gate insulating film 8 is thicker than that of the second gate insulating film 4. The field shield 9 is the offset gate in both N well 25 and P well 26. More specifically, the field shield 9 does not overlap with the source and drain layers 27 and 6. Furthermore, an ion implantation layer 14 determining the threshold value Vth of the p channel MOSFET 28 and the n channel MOSFET 29 and the threshold value Vth of the parasitic MOS transistor having the field shield MOS structure 11 is formed on the main surface of the N well 25 and the P well 26.

Similar to the embodiment shown in FIG. 1, in this embodiment also, a sidewall spacer 12 having its width set such that the field shield 9 is an offset gate is formed on the side portion of the field shield MOS structure 11, the source and drain layers 27 and 6 are formed on the surface of the semiconductor substrate 1 so as not to overlap with the field shield 9 and the film thickness of the first gate insulating film 8 is thicker than that of the second gate insulating 4. As a result, the Vth of the parasitic MOS transistor can be set high, so that the parasitic MOS effect can be effectively avoided. Also, for the same reason described in the first description, the submicron element isolation can be performed and the element can be miniaturized unlike the conventional field shield method. In addition, since the field shield 9 is the offset gate, its voltage resistance is improved.

Then, a description is given of the manufacturing processes of the semiconductor apparatus having a twin-tab structure shown in FIG. 2 in reference to figures.

Referring to FIG. 4A to 4L are sectional views of the semiconductor device showing its manufacturing process.

Figure 4A:
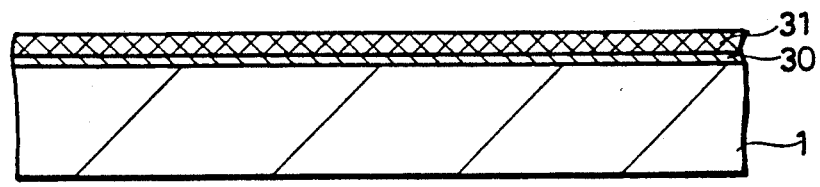
FIGS. 4A to 4L are sectional views of the semiconductor device shown in FIG. 2 showing its manufacturing processes.

Referring to FIG. 4A, a silicon oxide film 30 having the film thickness of approximately 300 Å is formed on a semiconductor substrate 1 of a p type silicon substrate and a silicon oxide film having the film thickness of approximately 500 Å is formed thereon.

Figure 4B:
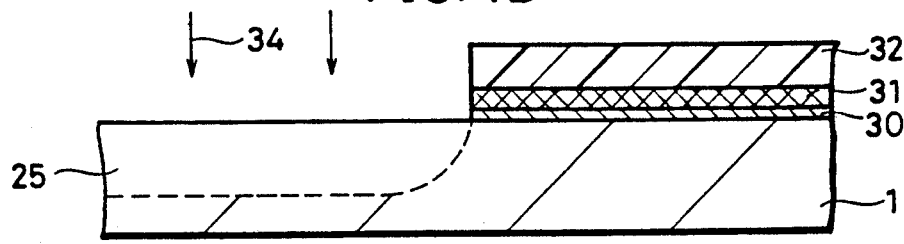

Then, referring to FIG. 4B, the silicon oxide film 30 and the silicon nitride film 31 of the portion in which an N well is to be formed are removed by usual photolithography and etching using a resist pattern 32. Thereafter, p+ ions 34 are implanted ($10^{12} \sim 10^{13}$ cm$^{-3}$) to form an N well 25 on the main surface of the semiconductor substrate 1.

Figure 4C:
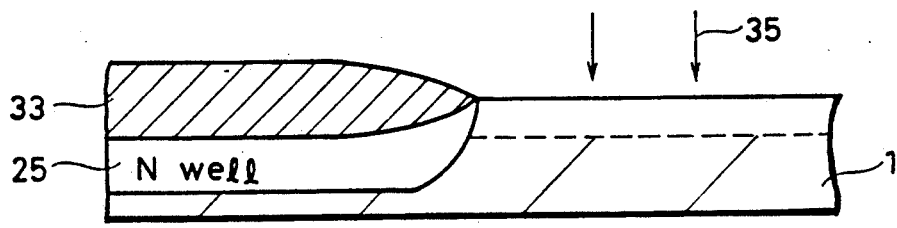

Then, referring to FIGS. 4B and 4C, the resist pattern 32 is removed to form a field oxide film 33 on the N well 25 by heat oxidation. Then, the silicon nitride film 31 and the silicon oxide film 30 are removed.

Figure 4D:
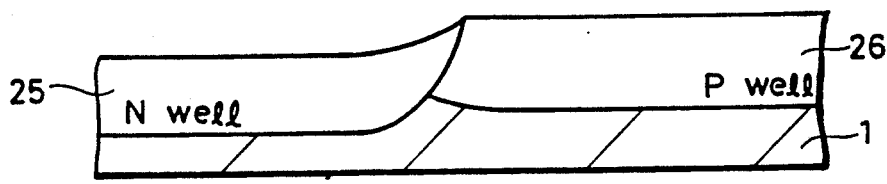

Referring to FIGS. 4C and 4D, B+ ions 35 are implanted to form a P well 26 on the main surface of the semiconductor substrate 1.

Figure 4E:
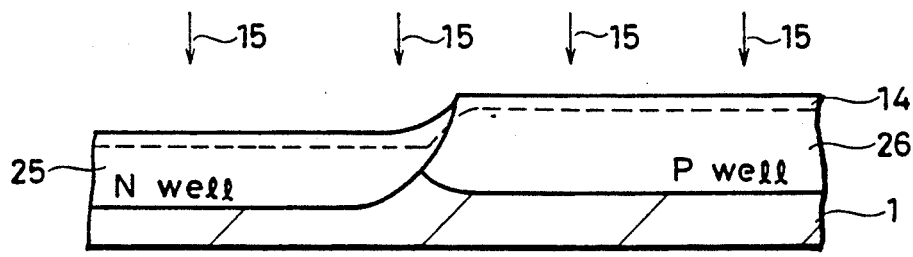

Referring to FIG. 4E, B+ and BF$_2$+ ions 15 serving as channel stoppers are implanted by approximately $10^{16} \sim 10^{17}$ cm$^{-3}$ on the surface of the N well 25 and the P well 26 to form an ion implanted layer 14. By this ion implantation, the threshold voltage Vth of the field shield MOS structure and the threshold value Vth of the MOSFET can be determined at the same time.

Figure 4F:
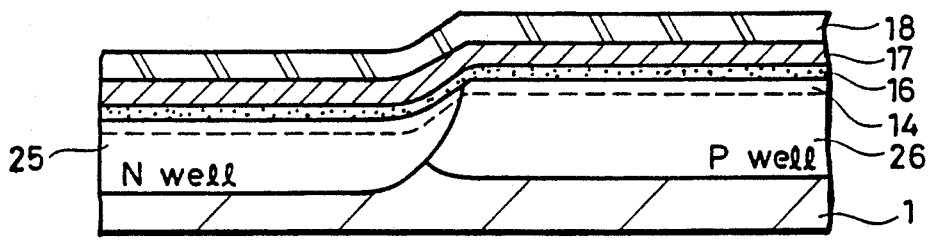

Referring to FIG. 4F, an oxide film (SiO$_2$) 16 serving as the first gate insulating film is formed on the main surface of the N well 25 and the P well 26 by the heat oxidation or CVD method. The film thickness of the oxide film 16 is approximately 200~1500 Å. Then, a polysilicon layer 17 serving as a conductive layer is deposited on the whole surface by approximately 1000~2000 Å by the LPCVD method. In addition, ion implantation may be made of POCl$_3$ onto this polysilicon layer 17 to reduce the resistance of the polysilicon layer 17. In addition, P-doped polysilicon may be deposited on the oxide film 16 by the LPCVD method. Then, a CVD oxide film 18 is deposited on the polysilicon layer 17, thereafter, these layers are patterned by usual photolithography and etching to form the field shield MOS structure 11 comprising the first gate insulating film 8, the field shield 9 formed on this first gate insulating film 8 and the patterned CVD oxide film 19 on the element isolating region comprising the boundary portion of the N well 25 and the P well 26, while the active regions of the N well 25 and the P well 26 are exposed.

Figure 4G:
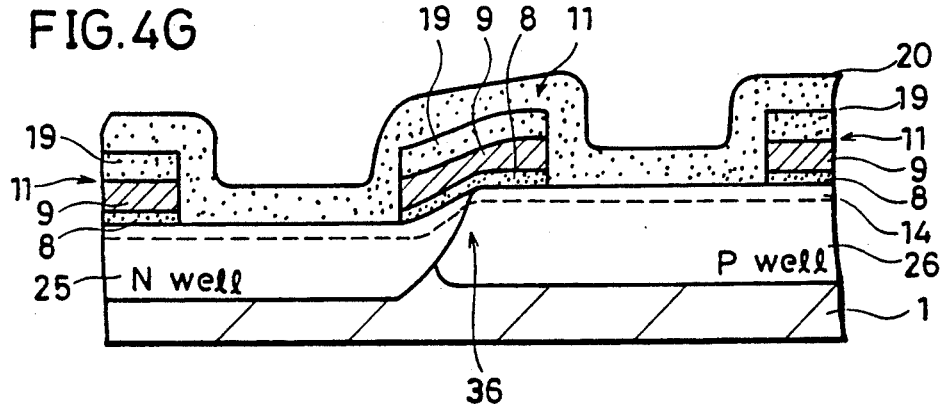

Referring to FIG. 4G, a CVD oxide film 20 is deposited on the whole surface of the semiconductor substrate 1 comprising the field shield MOS structure 11.

Figure 4H:
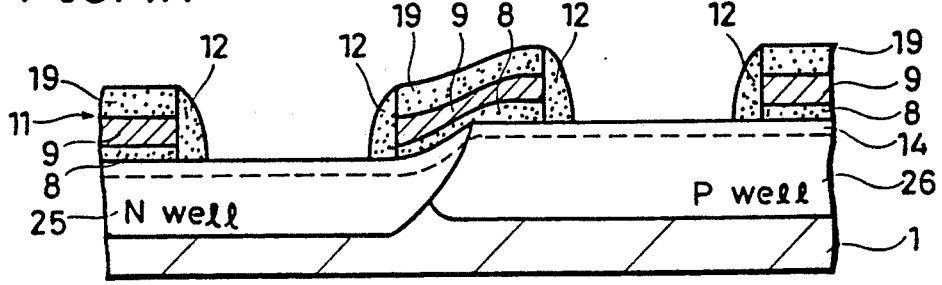

Thereafter, referring to FIG. 4H, the CVD oxide film 20 is etched away by reactive ion etching to form the sidewall 12 on the side portion of the field shield MOS structure 11. This sidewall 12 has its width set such that the field shield 9 is an offset gate. The width of the sidewall 12 is set by controlling the film thickness of the CVD oxide film 19 formed on the field shield 9, the film thickness of the CVD oxide film 20 deposited after the patterning of the field shield 9 and etching condition.

Figure 4I:
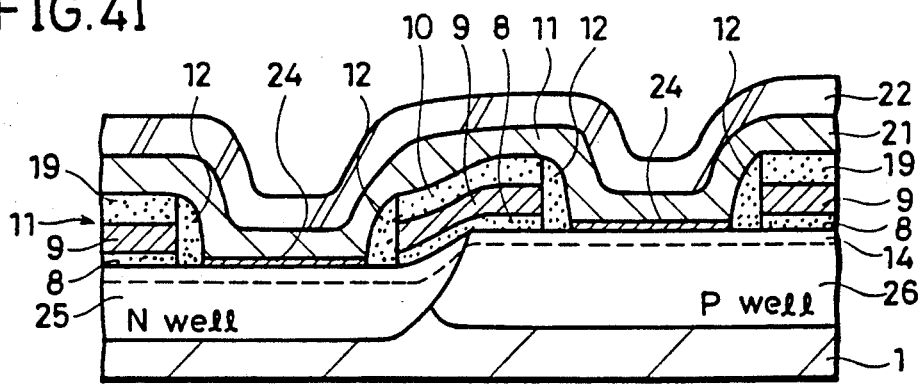

Then, referring to FIG. 4I, an oxide film 24 serving as the gate insulating film of the switching gate electrode is formed on the main surface of the N well 25 and the P well 26 by heat oxidation or CVD method. The film thickness of the oxide film 24 is adjusted to be 100~200 Å and thinner than that of the first gate insulating film 8. Then, a polysilicon layer 21 serving as a switching gate electrode is formed on the whole surface and then a CVD oxide film 22 is deposited thereon.

Figure 4J:
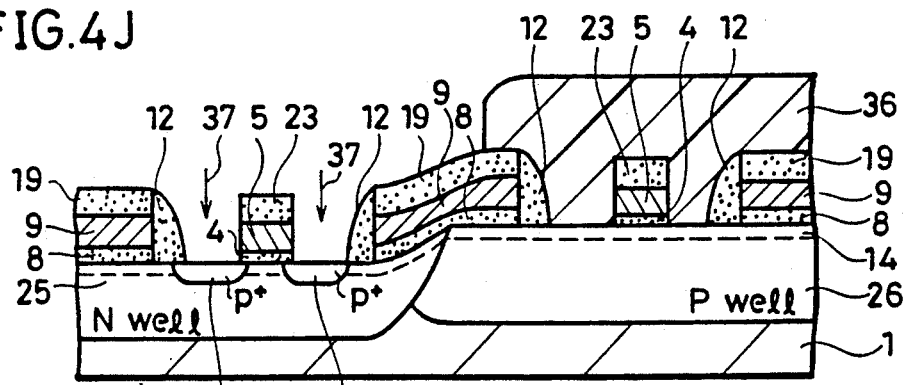

Referring to FIG. 4J, the oxide film 24, the polysilicon layer 21 and the CVD oxide film 22 are patterned by usual photolithography and etching to form an MOS structure comprising a second gate insulating film 4, a switching gate electrode 5 and a patterned CVD oxide film 23 in respective active regions of the N well 25 and the P well 26. Then, the side of the P well 26 is masked with a resist 36, while B+ ions 37 serving as p+ impurities are implanted onto the N well 25 in a self-aligning manner using the field shield 9, the sidewall spacer 12 and the switching gate electrode 5 as a mask for impurity introduction to form source and drain layer 27 on the main surface of the N well 25. Since ion implantation is performed using the sidewall spacer 12 as a mask, the field shield 9 does not overlap with the obtained source and drain layers 27. When the LDD transistor is made, a CVD oxide film is further deposited and then the sidewall spacer is formed on the side portion of the switching gate electrode 5 by reactive ion etching and thereafter, ion implantation is made again on the source and drain layers 27 and then, annealing treatment is subsequently performed.

Figure 4K:
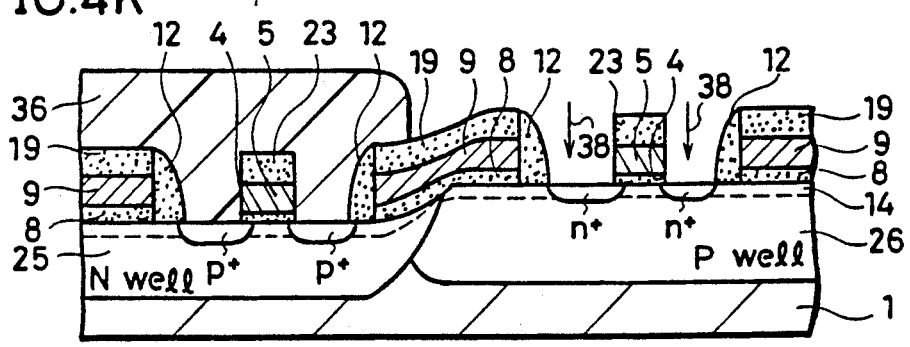

Referring to FIG. 4K, the side of N well 25 is masked with a resist 36, while As+ ions 38 of n+ impurities are implanted in a self-aligning manner on the main surface of the P well 26 using the field shield 9, the sidewall 12 and the switching gate electrode 5 as a mask for the introduction of impurities to form the source and drain layers 26 on the main surface of the P well 26. In this case also, since ion implantation is made using the sidewall spacer 12 as a mask, the filed shield 9 does not overlap with the obtained source and drain layers 6. Also, in this case also, when the LDD transistor is made, the CVD oxide film is farther deposited to form the sidewall spacer on the side portion of the switching gate electrode 5 by reactive ion etching and, thereafter, ion implantation is performed again on the source and drain layers 6 and the annealing treatment is made subsequently.

Figure 4L:
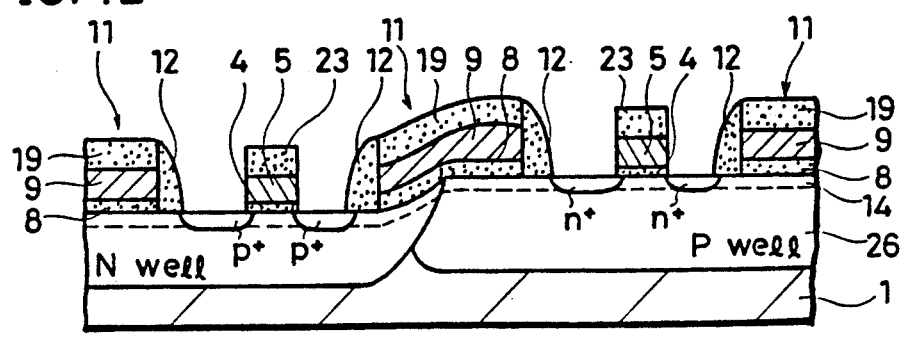
Figure 5:
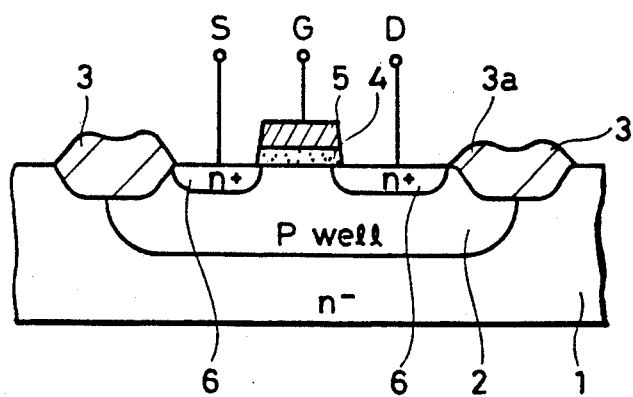
FIG. 5 is a sectional view of a conventional semiconductor device in which elements are isolated by an isolating oxide film by a LOCOS method.
Figure 6:
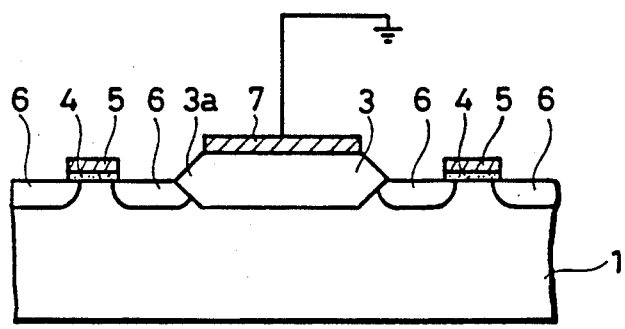
FIG. 6 is a sectional view of the conventional semiconductor device in which elements are isolated by a field plate method.

When the resist 36 is removed, there is provided a semiconductor device having the twin-tab structure shown in FIG. 4L. An interlayer insulating film is put (not shown) on the surface to make a wiring, so that the semiconductor device shown in FIG. 2 is provided.

Although description was made in a case where the field shield 9 and the switching gate electrode 5 are formed of polysilicon in the above-described embodiment, the present invention is not limited to this and it may be a polyside structure. Also, one may be polysilicon and the other may be polyside structure.

Although the CMOS of the twin-tab system was illustrated in the above-embodiment, the same effect as that of the embodiment can be implemented with a CMOS which is not the twin-tab system.

In addition, although B+ and BF$_2$+ were illustrated in the above-embodiment as ions determining the threshold values Vth of the field shield MOS structure and the MOSFET, the present invention is not limited to this and the same effect can be obtained with p+ and As+ ions, or the combination of B+ and BF$_2$+, and p+ and As+ ions.

As described above, according to the semiconductor device of the present invention, since the sidewall spacer having its width set such that the field shield may be the offset gate is formed on the side portion and source and drain layers are formed on the main surface of the semiconductor substrate so as not to overlap with the field shield, it is possible to set high the threshold value Vth of the parasitic MOS transistor and the plastic MOS effect can be effectively avoided. In addition, when the elements are miniaturized, it is not necessary to introduce the channel cut after the formation of the field shield like the conventional field shield method, the narrow channel effect is not generated. Therefore, it is possible to perform the submicron element isolation and miniaturize the elements. In addition, since the field shield is the offset gate, its voltage resistance can be improved.

According to the manufacturing method of the semiconductor device of the present invention, since ion implantation determining the threshold value of the MOSFET and the threshold value of the parasitic MOS transistor of the field shield MOS structure is made only one time, the processes can be simplified. Also, since impurity diffusion layers serving as source and drain regions are formed on the main surface of the semiconductor substrate using the field shield, the sidewall spacer and the switching gate impurity as a mask for the introduction of impurities, the field shield does not overlap with the source and drain layers. As a result, it is possible to set the value Vth of the parasitic MOS transistor high. As a result, it is possible to effectively avoid the parasitic MOS effect and miniaturize the devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A CMOS semiconductor device having two MOSFET's and a plurality of element isolating regions, said CMOS type semiconductor device comprising:
   a semiconductor substrate having a main surface;
   a field shield provided on an element isolating region formed over said semiconductor substrate at a region where said MOSFETS are adjacent to each other through a first gate insulating film to perform isolation between circit elements by applying a bias voltage to said field shield to prevent formation of a surface inversion layer;
   a switching gate electrode in each said MOSFET formed on said semiconductor substrate through a second insulating film in each said MOSFET; and
   source and drain layers formed at the opposite sides of a channel underlying said switching gate electrode on the main surface of said semiconductor substrate,
   said source and drain layers being formed spaced apart from said field shield in a direction of said channel so as not to overlap with said field shield,
   the film thickness of said first gate insulating film being made larger than that of second gate insulating film.

2. A semiconductor device in accordance with claim 1, wherein ion implanted layer determining the threshold value of said MOSFET and the threshold value of the parasitic MOS transistor of said field shield MOS structure is formed on the main surface of said semiconductor substrate.

3. A semiconductor device in accordance with claim 1, wherein the semiconductor device comprises a CMOS device made by combining a p channel MOSFET and an n channel MOSFET.

4. A semiconductor device in accordance with claim 3, wherein ion implanted layer determining the threshold value of the p channel MOSFET and, the threshold value of the n channel MOSFET and the threshold value of the parasitic MOS transistor of the field shield MOS structure is formed on the main surface of said semiconductor substrate.

* * * * *